(12) United States Patent
Luo et al.

(10) Patent No.: US 12,205,630 B2
(45) Date of Patent: Jan. 21, 2025

(54) SYMMETRIC MEMORY CELL AND BNN CIRCUIT

(71) Applicant: INSTITUTE OF MICROELECTRONICS, CHINESE ACADEMY OF SCIENCES, Beijing (CN)

(72) Inventors: Qing Luo, Beijing (CN); Bing Chen, Beijing (CN); Hangbing Lv, Beijing (CN); Ming Liu, Beijing (CN); Cheng Lu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 178 days.

(21) Appl. No.: 18/005,101

(22) PCT Filed: Aug. 24, 2020

(86) PCT No.: PCT/CN2020/110781
§ 371 (c)(1),
(2) Date: Jan. 11, 2023

(87) PCT Pub. No.: WO2022/040853
PCT Pub. Date: Mar. 3, 2022

(65) Prior Publication Data
US 2023/0267990 A1 Aug. 24, 2023

(51) Int. Cl.
*G11C 11/4096* (2006.01)
*G11C 11/408* (2006.01)
(Continued)

(52) U.S. Cl.
CPC ...... *G11C 11/4096* (2013.01); *G11C 11/4085* (2013.01); *G11C 11/4094* (2013.01); *H03K 19/01742* (2013.01)

(58) Field of Classification Search
CPC ............ G11C 11/4096; G11C 11/4085; G11C 11/4094; G11C 11/221; G11C 11/36;
(Continued)

(56) References Cited

U.S. PATENT DOCUMENTS 5,361,224 A 11/1994 Takasu
8,760,958 B2 6/2014 Iyer et al.
(Continued)

FOREIGN PATENT DOCUMENTS

CN 102738388 A 10/2012
CN 107657312 A 2/2018
(Continued)

OTHER PUBLICATIONS

International Search Report and Written Opinion for Chinese Application No. PCT/CN2020110781, dated May 12, 2021, 8 pages including English Translation.
(Continued)

*Primary Examiner* — Sultana Begum
(74) *Attorney, Agent, or Firm* — Christopher R. Christenson; Kelly, Holt & Christenson, P.L.L.C.

(57) ABSTRACT

Provided are a symmetric memory cell and a BNN circuit. The symmetric memory cell includes a first complementary structure and a second complementary structure, the second complementary structure being symmetrically connected to the first complementary structure in a first direction, wherein the first complementary structure includes a first control transistor configured to be connected to the second complementary structure, the second complementary structure includes a second control transistor, a drain electrode of the second control transistor and a drain electrode of the first control transistor being symmetrically arranged in the first direction and connected to a bit line, and the symmetric memory cell is configured to store a weight value 1 or 0.

14 Claims, 6 Drawing Sheets

(51) Int. Cl.
  *G11C 11/4094* (2006.01)
  *H03K 19/017* (2006.01)
(58) Field of Classification Search
  CPC .... G11C 11/54; G11C 5/06; H03K 19/01742; G06N 3/063
  See application file for complete search history.

(56) References Cited

U.S. PATENT DOCUMENTS

| | | |
|---|---|---|
| 9,147,466 B2 | 9/2015 | Iyer et al. |
| 9,520,178 B2 | 12/2016 | Iyer et al. |
| 10,249,360 B1 | 4/2019 | Chang et al. |
| 10,262,726 B1 | 4/2019 | Chang |
| 10,964,362 B2 | 3/2021 | Jiang et al. |
| 11,114,166 B2 | 9/2021 | Okuyama et al. |
| 2011/0085371 A1 | 4/2011 | Wang |
| 2013/0064003 A1 | 3/2013 | Badrudduza et al. |
| 2013/0242677 A1 | 9/2013 | Iyer et al. |
| 2015/0003148 A1 | 1/2015 | Iyer et al. |
| 2015/0318332 A1* | 11/2015 | Lu ............... H10N 70/841 257/4 |
| 2015/0357030 A1 | 12/2015 | Iyer et al. |
| 2019/0205095 A1 | 7/2019 | Gupta et al. |
| 2019/0244087 A1 | 8/2019 | Park et al. |
| 2020/0202948 A1 | 6/2020 | Okuyama et al. |
| 2020/0342921 A1 | 10/2020 | Jiang et al. |

FOREIGN PATENT DOCUMENTS

| | | |
|---|---|---|
| CN | 108110007 A | 6/2018 |
| CN | 108336145 A | 7/2018 |
| CN | 109979503 A | 7/2019 |
| CN | 111081298 A | 4/2020 |
| CN | 111354400 A | 6/2020 |
| DE | 202020102287 U1 | 5/2020 |

OTHER PUBLICATIONS

First Office Action for Chinese Application No. 202010860294.0, dated Jul. 4, 2022, 26 pages including English Translation.

* cited by examiner

SYMMETRIC MEMORY CELL AND BNN CIRCUIT

CROSS-REFERENCE TO RELATED APPLICATION

This application is a Section 371 National Stage Application of International Application No. PCT/CN2020/110781, filed on Aug. 24, 2020, entitled "SYMMETRIC MEMORY CELL AND BNN CIRCUIT".

TECHNICAL FIELD

The present disclosure relates to a field of microelectronic manufacturing and memory technology, and in particular, relates to a symmetric memory cell and a BNN circuit.

BACKGROUND

Since the beginning of the 21st century, the explosive growth of the information amount has accelerated the development of the information technology industry. New information technologies such as the Internet of Things, cloud computing, and mobile intelligent terminals are affecting and changing people's lifestyles and social forms. With the advent of the era of big data, the data scale is getting larger and larger, ranging from terabytes (TB) to petabytes (PB), the data types are various, including both traditional structured data and unstructured data such as text, picture, audio and video, and the proportion of unstructured data is growing rapidly.

The rapid growth of data makes it difficult to guarantee the timeliness of data processing. The features of large scale and real-time processing brought by big data have a huge contradiction with the traditional computing centered model, and this makes it difficult for a traditional computing model to adapt to data processing in the current big data environment. Data processing has shifted from being computing centered to data centered. Therefore, there may exist an input/output (I/O) bottleneck in the big data processing through the traditional in-memory-disk access model. The problem of processing speed is becoming more and more prominent, and the timeliness is difficult to be guaranteed.

On the whole, the traditional computing centered model faces many problems such as a limited memory capacity, a high input/output (I/O) pressure, a low cache hit rate, and a low overall performance of data processing. Therefore, a breakthrough to the traditional computing model is an effective way to deal with the new challenges brought by the era of big data.

SUMMARY

According to an aspect of the present disclosure, there is provided a symmetric memory cell, including a first complementary structure and a second complementary structure, the second complementary structure being symmetrically connected to the first complementary structure in a first direction. The first complementary structure includes a first control transistor configured to be connected to the second complementary structure. The second complementary structure includes a second control transistor, a drain electrode of the second control transistor and a drain electrode of the first control transistor being symmetrically arranged in the first direction and being connected to a bit line. The symmetric memory cell is configured to store a weight value 1 or 0.

According to the embodiments of the present disclosure, a gate electrode of the first control transistor is connected to a positive word line, and a gate electrode of the second control transistor is connected to a complementary word line. The first control transistor and the second control transistor are configured to control a reading and a writing of the symmetric memory cell.

According to the embodiments of the present disclosure, the first complementary structure further includes: a first pull-up diode, one end of the first pull-up diode being configured to connect to a working voltage $V_{DD}$, another end of the first pull-up diode being connected to a source end of the first control transistor, and the first pull-up diode being configured to control a high level input; a first pull-down diode, one end of the first pull-down diode being grounded to a $V_{GND}$, another end of the first pull-down diode being connected to the source end of the first control transistor, and the first pull-down diode being configured to control a low level input; wherein the first pull-up diode and the first pull-down diode are symmetrically arranged in a second direction, and the second direction is perpendicular to the first direction.

According to the embodiments of the present disclosure, when a weight value 1 is stored in the symmetric memory cell, opening directions of the first pull-up diode and the first pull-down diode point to the source end of the first control transistor, and the first pull-up diode and the first pull-down diode are programmable diodes.

According to the embodiments of the present disclosure, the second complementary structure further includes: a second pull-up diode, one end of the second pull-up diode being configured to be connected to a working voltage $V_{DD}$, another end of the second pull-up diode being connected to a source end of the second control transistor, and the second pull-up diode being configured to control a high level input; a second pull-down diode, one end of the second pull-down diode being grounded to a $V_{GND}$, and another end of the second pull-down diode being connected to the source end of the second control transistor, and the second pull-down diode being configured to control a low level input; wherein the second pull-up diode and the second pull-down diode are symmetrically arranged in a second direction.

According to the embodiments of the present disclosure, when a weight value 0 is stored in the symmetric memory cell, opening directions of the second pull-up diode and the second pull-down diode point to the source end of the second control transistor, and the second pull-up diode and the second pull-down diode are programmable diodes.

According to the embodiments of the present disclosure, the programmable diode includes a lower electrode layer, a dielectric layer and an upper electrode layer. The lower electrode layer is configured to support the programmable diode and provide a lower electrode of the programmable diode. The dielectric layer is formed on the lower electrode layer and configured as a functional layer of the programmable diode, so as to be kept in a stable state after a withdrawal of an electrical signal. The upper electrode layer is formed on the dielectric layer and configured to provide an upper electrode of the programmable diode.

According to the embodiments of the present disclosure, the lower electrode layer is composed of at least one of W, Al, Ti, Ta, Ni, Hf, TiN or TaN. The dielectric layer is composed of at least one material having a ferroelectric property among a perovskite ferroelectric material, a ferroelectric polymer-PVDF material or an $HfO_2$-based ferroelectric material, or composed of a dielectric material having a charged defect. The upper electrode layer is composed of at least one of W, Al, Cu, Ru, Ti, Ta, TiN, TaN, IrO$_2$, ITO or IZO.

According to the embodiments of the present disclosure, the HfO$_2$-based ferroelectric material is an HfO$_2$-based material doped with at least one element of Zr, Al, Si, or La.

According to another aspect of the present disclosure, there is provided a BNN circuit, including a multi-level neural network layer. Each level of the neural network layer of the multi-level neural network layer includes a plurality of memory cell array groups arranged in parallel in a second direction. Each memory cell array group among the plurality of memory cell array groups includes a plurality of symmetric memory cells and an interface module. The plurality of symmetric memory cells are arranged in a first direction for storing a weight value 1 or 0. The interface module is arranged at one end of each memory cell array group, and configured for an input and an output of each memory cell array group.

According to the embodiments of the present disclosure, the interface module includes a first inverter and a second inverter, the second inverter being connected to the first inverter in series and configured to correct an output waveform to a high level and/or a low level for a binarization.

According to the embodiments of the present disclosure, one end of the first inverter is connected to a working voltage $V_{DD}$, another end of the first inverter is grounded to a $V_{GND}$, and an input end of the first inverter is connected to a bit line of each memory cell array group; and one end of the second inverter is connected to the working voltage $V_{DD}$, another end of the second inverter is grounded to the $V_{GND}$, an input end of the second inverter is connected to an output end of the first inverter, and the output end of the second inverter is connected to a positive word line of a next level neural network layer adjacent to the each level of the neural network layer.

According to the embodiments of the present disclosure, the interface module further includes a third inverter, wherein one end of the third inverter is connected to a working voltage $V_{DD}$, another end of the third inverter is grounded to a $V_{GND}$, an input end of the third inverter is connected to an output end of the second inverter, and an output end of the third inverter is connected to a complementary word line of a next level neural network layer adjacent to the each level of the neural network layer.

DETAILED DESCRIPTION OF EMBODIMENTS

Figure 1A:
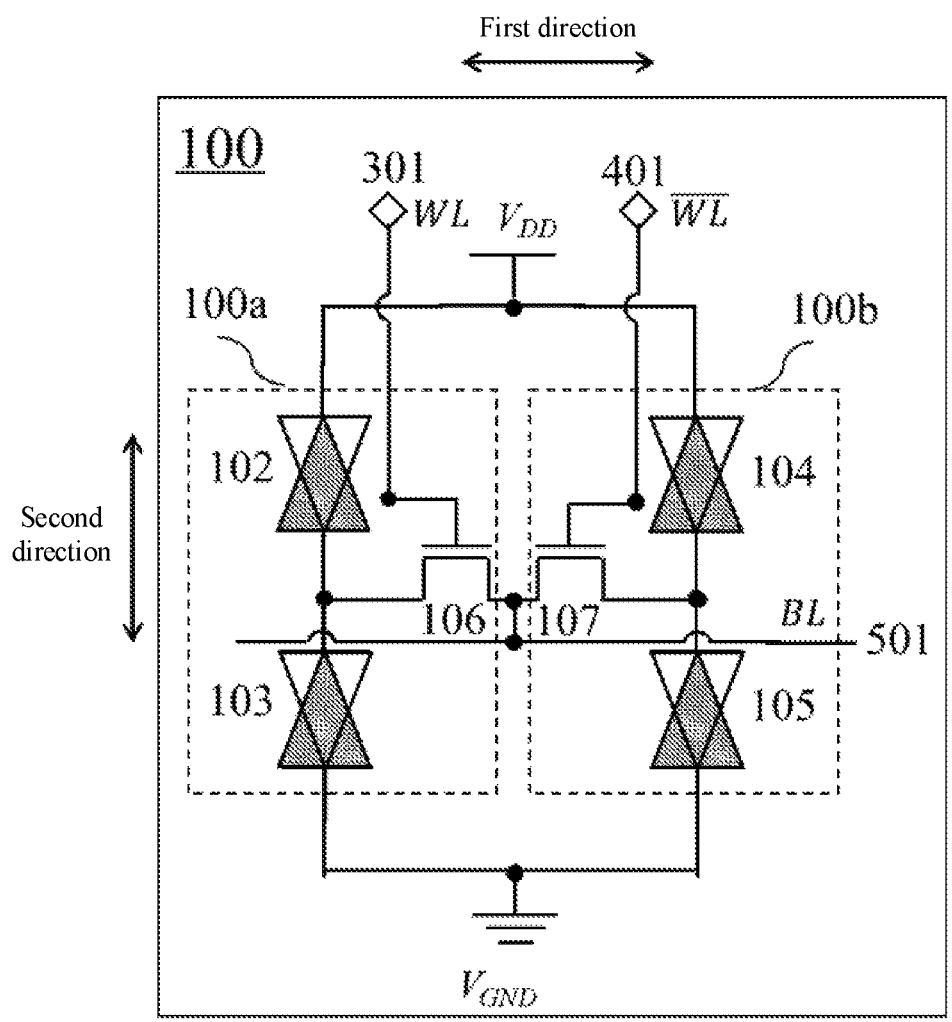
FIG. 1A is a schematic diagram of a structural composition of a symmetric memory cell according to the embodiments of the present disclosure.

In order to make the objectives, technical solutions and advantages of the present disclosure clearer, the present disclosure will be further described in detail below with reference to the specific embodiments and the accompanying drawings.

It should be noted that, in the accompanying drawings or the text of the description, the embodiments that are not shown or described are forms known to those skilled in the art, and are not illustrated in detail. In addition, the above definitions to various elements and methods are not limited to various specific structures, shapes or manners mentioned in the embodiments, and those skilled in the art may simply make a modification or replacement to them.

It should also be noted that the directional terms mentioned in the embodiments, such as "upper", "lower", "front", "rear", "left", "right", etc., are only directions of the reference drawings, and are not used to limit the scope of protection of the present disclosure. Throughout the drawings, a same element is denoted by a same or similar reference number. A conventional structure or construction will be omitted when it may lead to obscuring an understanding to the present disclosure.

Moreover, the shapes and sizes of the components in the figures do not reflect the actual size and proportion, but merely illustrate the contents of the embodiments of the present disclosure. In addition, in the claims, any reference signs located between parentheses should not be construed as limiting the claims.

Furthermore, the word "comprise/include" does not exclude the existence of elements or steps not listed in a claim. The word "a" or "an" preceding an element does not exclude the existence of a plurality of such elements.

The ordinal numbers such as "first", "second", "third", etc. used in the description and the claims are used to describe the corresponding elements. They themselves neither mean that the elements have any ordinal numbers, and nor do they represent an order of an element relative to another element or an order in the manufacturing method. The use of these ordinal numbers is only used to clearly distinguish an element with a certain name from another element with the same name.

Those skilled in the art may understand that the modules in a device in an embodiment may be adaptively modified and arranged in one or more devices different from that in the embodiment. The modules or units or components in an embodiment may be combined into one module or unit or assembly, and furthermore they may be divided into a plurality of submodules or subunits or subassemblies. Unless at least some of such features and/or procedures or units are mutually exclusive, all features disclosed in the specification (including appended claims, abstract and drawings) and all processes or units of any method or device disclosed in this manner may be combined by any means. Unless otherwise expressly stated, each feature disclosed in the present specification (including appended claims, abstract and drawings) may be replaced by an alternative feature providing the same, equivalent or similar object. Moreover, in a unit claim listing several devices, some of these devices may be embodied by a same hardware item.

Similarly, it should be understood that in order to simplify the present disclosure and help understanding one or more of various aspects of the present disclosure, in the above description of the exemplary embodiments of the present disclosure, various features of the present disclosure are sometimes grouped together into a single embodiment, figure, or description thereof. However, such manner of disclosure should not be interpreted as reflecting an intention that the present disclosure requires more features than those that are expressly recited in each claim. More exactly, as reflected by the claims below, the disclosed aspects are less than all features in a single embodiment disclosed in the preceding text. Therefore, the claims following the specific embodiments are hereby expressly incorporated into the specific embodiments, and each claim itself is taken as a separate embodiment of the present disclosure.

In recent years, in order to solve the problems of data processing speed and timeliness in the era of big data, In-Memory Computing has become a hot spot in the industry and research field. The reason lies in that in the in-memory computing mode, all data is loaded into the in-memory during the initialization phase, operations of data processing and query are performed in a high level in-memory, and the CPU directly reads data from the in-memory for real-time computation and analysis. This reduces the disk data access, reduces the impact of the network and the disk I/O, greatly improves the throughput and processing speed of computing and processing data, and reduces the I/O overhead that originally occupies a large amount of computing resources.

Through the application of an in-memory computing, the I/O bottleneck is avoided. A result obtained by calculation in few hours or days previously may be obtained in seconds in an in-memory computing environment. In recent years, with the continuous development of convolutional neural networks, and the depth of the networks continues increasing, and this puts forward higher and higher requirements for the computing power and storage space of a hardware device. Reducing the resource consumption of the convolutional neural networks is of great significance on the deployment of deep learning on an embedded platform.

Binarized Neural Networks (BNN) may effectively improve the computing efficiency of a hardware device, and they may not only accelerate the hardware computing, but also reduce the memory overhead, thereby providing a new method for the deployment of deep learning on an embedded device. However, a BNN circuit of a traditional resistive memory (such as Resistive Random Access Memory, RRAM for short) generally requires a sensitive current amplifier and a complex reading circuit, which greatly increases the area, time delay and power consumption. A BNN circuit based on Static Random-Access Memory (SRAM) still has the technical problems of:

(1) no power-off retention feature and a huge power consumption;

(2) failure to achieve a large scale parallel inference operation due to an excessively large current of a weight unit.

Therefore, a traditional BNN circuit based on a device such as SRAM still needs further improvement to solve one of the above technical problems.

In order to solve at least one of the technical problems existing in a BNN circuit based on a device such as SRAM in the prior art, according to the present disclosure, there is provided a symmetric memory cell and a BNN circuit.

As shown in FIG. 1A-FIG. 2B, according to an aspect of the present disclosure, there is provided a symmetric memory cell 100, including: a first complementary structure 100a and a second complementary structure 100b, the second complementary structure 100b being symmetrically connected to the first complementary structure 100a in a first direction. The first complementary structure 100a includes a first control transistor 106 configured to be connected to the second complementary structure 100b. The second complementary structure 100b includes a second control transistor 107, a drain electrode of the second control transistor 107 and a drain electrode of the first control transistor 106 being symmetrically arranged in the first direction and connected to a bit line BL. The symmetric memory cell 100 is configured to store a weight value 1 or 0.

The first complementary structure 100a of the first control transistor 106 and the second complementary structure 100b of the second control transistor 107 constitute a complementary symmetric memory cell as a memory cell having a weight vale of 1 or 0, i.e., a weight unit.

As shown in FIG. 1A-FIG. 2B, according to the embodiments of the present disclosure, a gate electrode of the first control transistor 106 is connected to a positive word line WL301, and a gate electrode of the second control transistor 107 is connected to a complementary word line $\overline{WL}$401. The first control transistor 106 and the second control transistor 107 are configured to control a reading and a writing of the symmetric memory cell.

As shown in FIG. 1A-FIG. 2B, according to the embodiments of the present disclosure, the first complementary structure 100a further includes a first pull-up diode 102 and a first pull-down diode 103. One end of the first pull-up diode 102 is configured to connect to a working voltage $V_{DD}$, another end thereof is connected to a source end of the first control transistor 106, and the first pull-up diode 102 is configured to control a high level input when the memory cell performs a reading operation. One end of the first pull-down diode 103 is grounded to a $V_{GND}$, another end thereof is connected to the source end of the first control transistor 106, and the first pull-down diode 103 is configured to control a low level input when the memory cell performs a reading operation. The first pull-up diode 102 and the first pull-down diode 203 are symmetrically arranged in a second direction, the second direction being perpendicular to the first direction.

As shown in FIG. 1A-FIG. 2B, according to the embodiments of the present disclosure, the second complementary structure 100b further includes a second pull-up diode 104 and a second pull-down diode 105. One end of the second pull-up diode 104 is configured to be connected to a working voltage $V_{DD}$, another end thereof is connected to a source end of the second control transistor 107, the second pull-up diode 104 is configured to control a high level input when the memory cell performs a reading operation. One end of the second pull-down diode 105 is grounded to a $V_{GND}$, another end thereof is connected to the source end of the second control transistor 107, and the second pull-down diode 105 is configured to control a low level input when the memory cell performs a reading operation. The second pull-up diode 104 and the second pull-down diode 105 are symmetrically arranged in a second direction.

It should be seen that the symmetric memory cell 100 of the present disclosure is constituted by the first control transistor 106, the first pull-up diode 102, the first pull-down diode 103, the second control transistor 107, the second pull-up diode 104 and the second pull-down diode 106 to form the weight unit for storing the weight 1 or 0.

Figure 2A:
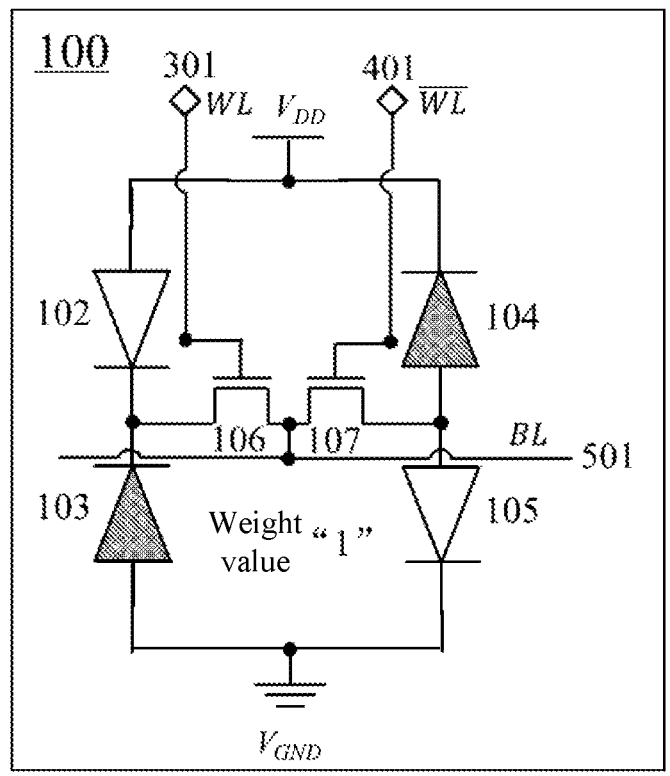
FIG. 2A is a schematic diagram of an opening direction when a storing weight value of a symmetric memory cell is 1 according to the embodiments of the present disclosure.

As shown in FIG. 2A, according to the embodiments of the present disclosure, when a weight value 1 is stored in the symmetric memory cell 100, opening directions of the first pull-up diode 102 and the first pull-down diode 103 point to the source end of the first control transistor 106, and the first pull-up diode 102 and the first pull-down diode 103 are programmable ferroelectric diodes.

The opening directions may be understood as the respective current flow directions in the first pull-up diode 102 and the first pull-down diode 103. That is, when the opening directions point to the source end of the first control transistor 106, this means that the current of the first pull-up diode 102 flows toward the source end of the first control transistor 106 and the current of the first pull-down diode 103 also flows toward the source end of the first control transistor 106. Meanwhile, an opening direction of the second pull-up diode 104 points to the working voltage $V_{DD}$, and an opening direction of the second pull-down diode 105 points to the ground $V_{GND}$.

Figure 2B:
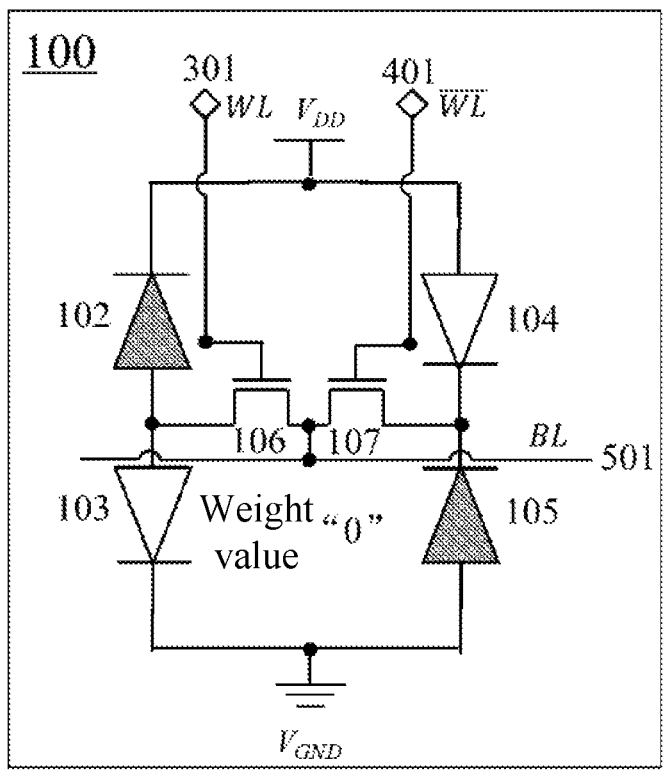
FIG. 2B is a schematic diagram of an opening direction when a storing weight value of a symmetric memory cell is 0 according to the embodiments of the present disclosure.

As shown in FIG. 2B, according to the embodiments of the present disclosure, when a weight value 0 is stored in the symmetric memory cell 100, opening directions of the second pull-up diode 104 and the second pull-down diode 105 point to the source end of the second control transistor 107, and the second pull-up diode 104 and the second pull-down diode 105 are programmable diodes.

The opening directions may be understood as the respective current flow directions in the second pull-up diode 104 and the second pull-down diode 105. That is, when the opening directions point to the source end of the second control transistor 107, this means that the current of the second pull-up diode 104 flows toward the source end of the second control transistor 107 and the current of the second pull-down diode 105 also flows toward the source end of the second control transistor 107. Meanwhile, an opening direction of the first pull-up diode 102 points to the working voltage $V_{DD}$, and an opening direction of the first pull-down diode 103 points to the ground $V_{GND}$.

Figure 3A:
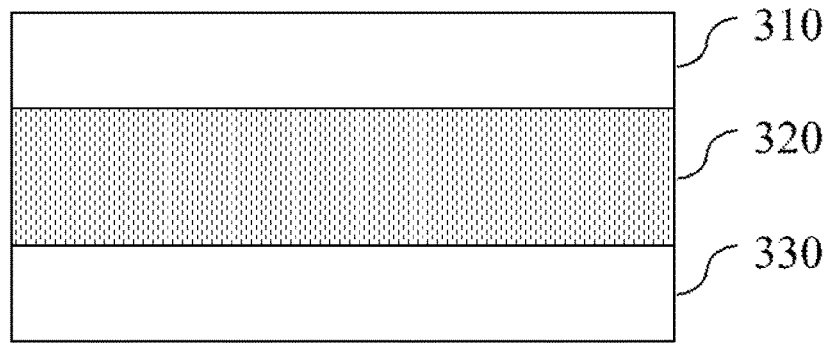
FIG. 3A is a schematic diagram of a structural composition of a programmable diode according to embodiments of the present disclosure.

As shown in FIG. 3A, according to the embodiments of the present disclosure, the programmable diode 300 includes a lower electrode layer 330, a dielectric layer 320 and an upper electrode layer 310. The lower electrode layer 330 is configured to support the programmable diode 300 and provide a lower electrode of the programmable diode 300. The dielectric layer 320 is formed on the lower electrode layer 330 and configured as a functional layer of the programmable diode 300, so as to be kept in a stable state after a withdrawal of an electrical signal. The upper electrode layer 310 is formed on the dielectric layer 320 and configured to provide an upper electrode of the programmable diode 300.

According to the embodiments of the present disclosure, when a positive read voltage Vr is applied to a lower electrode layer 330, the programmable diode has at least the following two states:

State 1: An absolute value of the current flowing through the diode is less than an absolute value of the current when a negative reading voltage −Vr of the same magnitude is applied;

State 2: An absolute value of the current flowing through the diode is greater than an absolute value of the current when a negative reading voltage −Vr of the same magnitude is applied.

When a reading voltage Vr of a specific absolute value is applied to the programmable diode, a state in which a ratio of an absolute value of a forward current to that of a negative current is a maximum is a highest positive state, and a state in which a ratio of an absolute value of a forward current to that of a negative current is a minimum is a highest negative state. In addition, when a reading voltage of a specific absolute value is applied to the programmable diode in different internal states, multiple values or a continuously varying value of the highest positive state and the highest negative state may be taken as a ratio of an absolute value of a forward current to that of a negative current, so that the programmable diode may be in different multiple states or a continuously varying state, thereby adjusting the current flow. In addition, when the programmable diode is used in a resistive memory, the forward voltage may be used as the reading voltage, the forward conduction state may be regarded as a low resistance state, and the reverse conduction state may be regarded as a high resistance state, which are respectively configured to store 0 and 1.

According to the embodiments of the present disclosure, the programmable diode 300 may be a programmable diode having a ferroelectric material, i.e., a ferroelectric diode. The lower electrode layer 330 is composed of at least one of W, Al, Ti, Ta, Ni, Hf, TiN or TaN. The dielectric layer 320 is composed of at least one material having a ferroelectric property among a perovskite ferroelectric material, a ferroelectric polymer-PVDF material or an $HfO_2$-based ferroelectric material, or composed of a dielectric material having a charged defect. The upper electrode layer 310 is composed of at least one of W, Al, Cu, Ru, Ti, Ta, TiN, TaN, $IrO_2$, ITO or IZO.

Figure 3B:
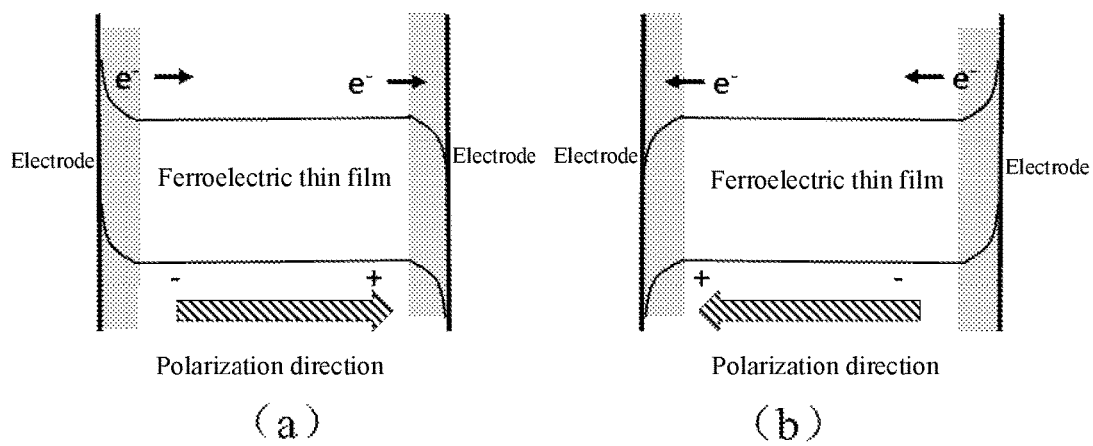
FIG. 3B is a schematic diagram of a technical principle of a programmable diode according to the embodiments of the present disclosure.

As shown in FIG. 3B, in the dielectric layer 320 made of a material having a ferroelectric property, before the ferroelectric thin film of the dielectric layer 320 is polarized, Schottky junctions, i.e., Schottky contacts are respectively formed at the places where the upper electrode and the lower electrode are in contact. After polarization, the polarized electric field causes directional movement of electrons. As shown in (a) of FIG. 3B, the electrons on the left move toward the inside of the ferroelectric film, enhancing of the Schottky barrier at the interface; and the electrons on the right move toward the interface, reducing the Schottky barrier. When the electrons gather to a certain amount, an ohmic contact is formed, so that there is a Schottky contact on one side and there is an ohmic contact another side, thereby forming a unidirectional conductive diode. When an electric domain is inversed, the direction of the polarized electric field is changed, and the direction of the electron movement is also inversed, and this results in a Schottky contact on the right side and an ohmic contact on the left side, and the conduction direction of the diode is then also inversed, as shown in (b) of FIG. 3B.

In the embodiments of the present disclosure, as the above ferroelectric diode has a power-off retention feature achieved by a ferroelectric inversion (i.e., when the ferroelectric diode loses the electrical signal, it still has the feature of being kept in a stable state), so that an operation response speed of the above complementary memory reaches a nanosecond level, thereby achieving an application of the memory.

Figure 3C:
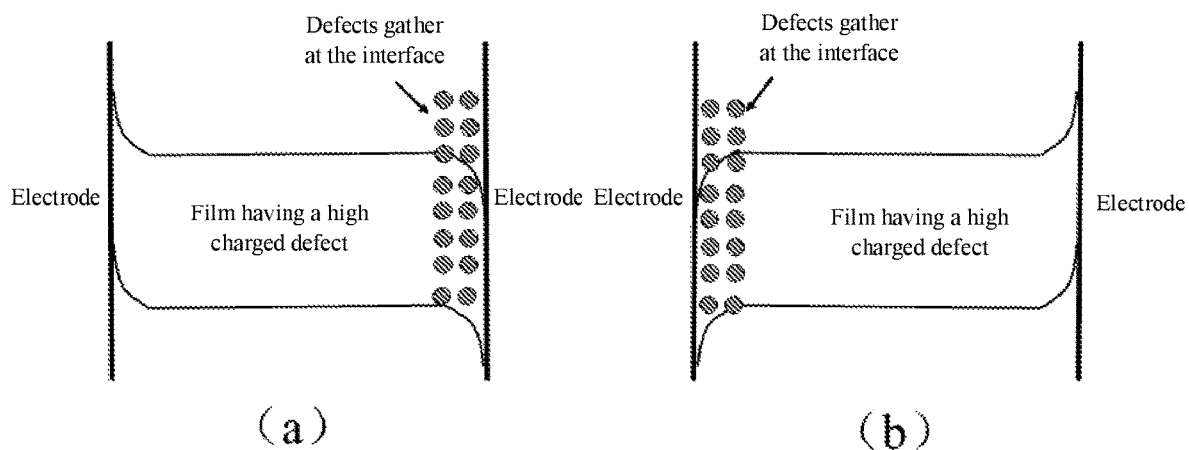
FIG. 3C a schematic diagram of another technical principle of another programmable diode according to the embodiments of the present disclosure.

As shown in FIG. 3C, according to the embodiments of the present disclosure, the programmable diode 300 may also be a diode having a dielectric material with more charged defects. As the dielectric film in the dielectric layer 320 is prepared using a dielectric material with more charged defects, a large amount of charged defects, such as positively charged oxygen vacancies, may exist in the dielectric layer 320. Under an action of the electric field, the defects gather to an interface region, leading to a destruction of the original Schottky contact. As a result, a Schottky contact is formed on one side and an ohmic contact is formed on another side, thereby forming a unidirectional conduction feature of the diode, as shown in (a) of FIG. 3C. After a reverse voltage is applied to the diode, the defects gathered to another side, and the conduction direction of the diode is reversed, as shown in (b) of FIG. 3C.

Therefore, when a voltage greater than a forward threshold voltage $V_0=6V$ of the diode 300 is applied between the lower electrode 330 and the upper electrode 310, the diode 300 is forward polarized. This is shown as that when a positive reading voltage Vr is applied to the lower electrode 330, the absolute value of the current flowing through the diode 300 is greater than the absolute value when the negative reading voltage -Vr of the same magnitude is applied, and a corresponding stable feature is kept after a power-off. When a voltage less than the negative threshold voltage $-V_0$ is applied between the electrode 101 and the electrode 102, the diode 300 is negatively polarized. This is shown as that when a positive reading voltage Vr is applied to the lower electrode 330, the absolute value of the current flowing through the diode 300 is smaller than the absolute value of the current when the negative reading voltage -Vr of the same magnitude is applied, and a corresponding feature is kept after a power-off. It can be seen that the programmable diode 300 may keep a good power-off retention feature in both the positive polarization and the negative polarization. The power-off retention feature is a property with which the programmable diode 300 may be still kept in a stable state after a withdrawal of an electrical signal.

Figure 3D:
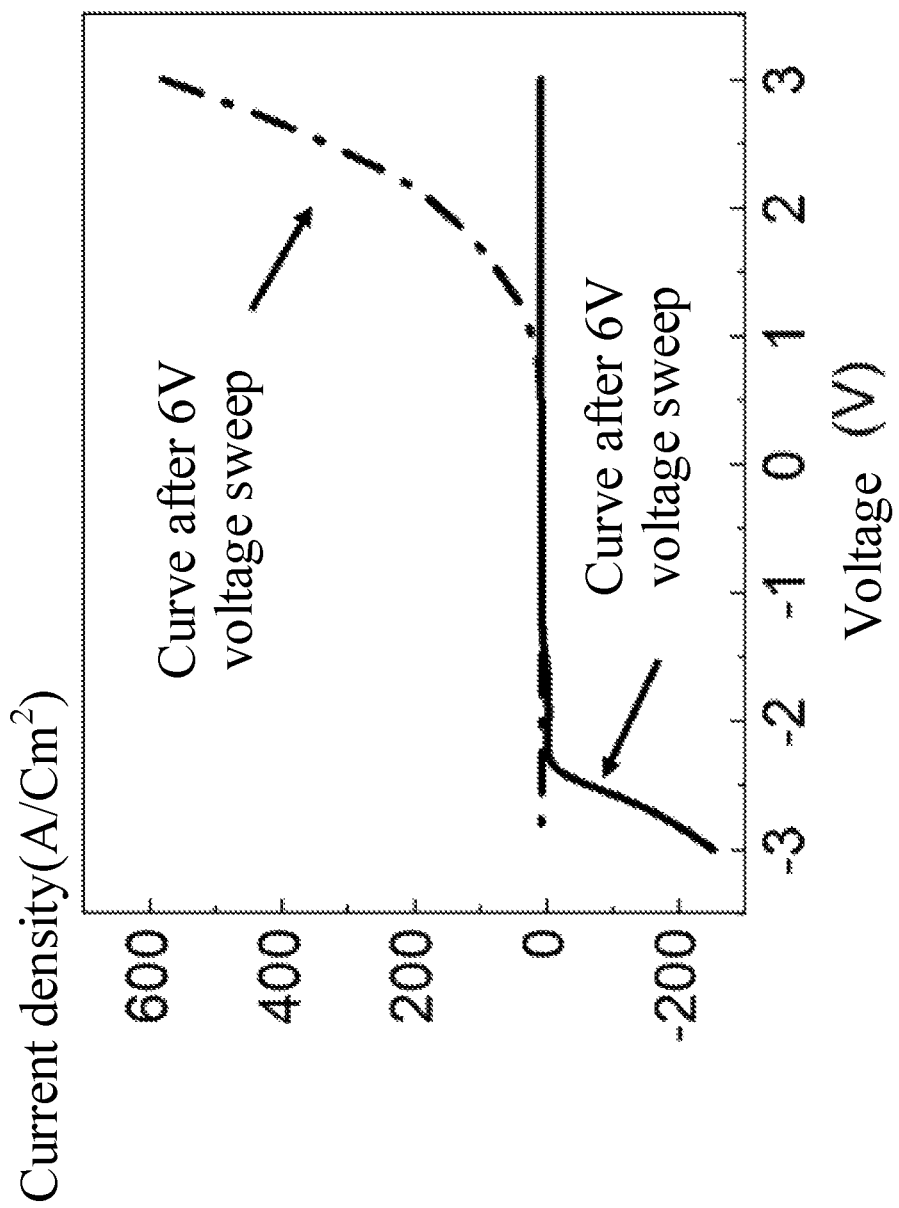
FIG. 3D is a diagram of a current-voltage characteristics curve of a programmable diode according to the embodiments of the present disclosure.

As shown in FIG. 3D, after a bias scan voltage is additionally applied from 0 to 6V, the programmable diode show a feature of a diode that is turned on in a forward direction, and after a bias scan voltage is additionally applied from 0 to -6V, the programmable diode shows a feature of a diode that is turned on in a reverse direction. That is, the programmable diode exhibits a good current flow adjustment effect. Thereby, the symmetric memory cell of the present disclosure achieves the current flow adjustment, so that the memory based on the BNN circuit in the present disclosure has an extremely high practicality, and scientific research and commercial values.

According to the embodiments of the present disclosure, the $HfO_2$-based ferroelectric material is an $HfO_2$-based material doped with at least one element of Zr, Al, Si, and La, so as to better produce the ferroelectric inversion effect and achieve the above power-off retention feature.

With the above programmable diode, the above symmetric memory cell of the present disclosure has a power-off retention feature, and the power-off retention feature is determined by its own material feature, so that the power consumption is reduced. On the other hand, with the cooperation of the first control transistor and the second control transistor, when the weight value 1 or 0 is stored in the symmetric memory cell of the present disclosure, an excessively large current of the weight unit may be effectively prevented.

Figure 4:
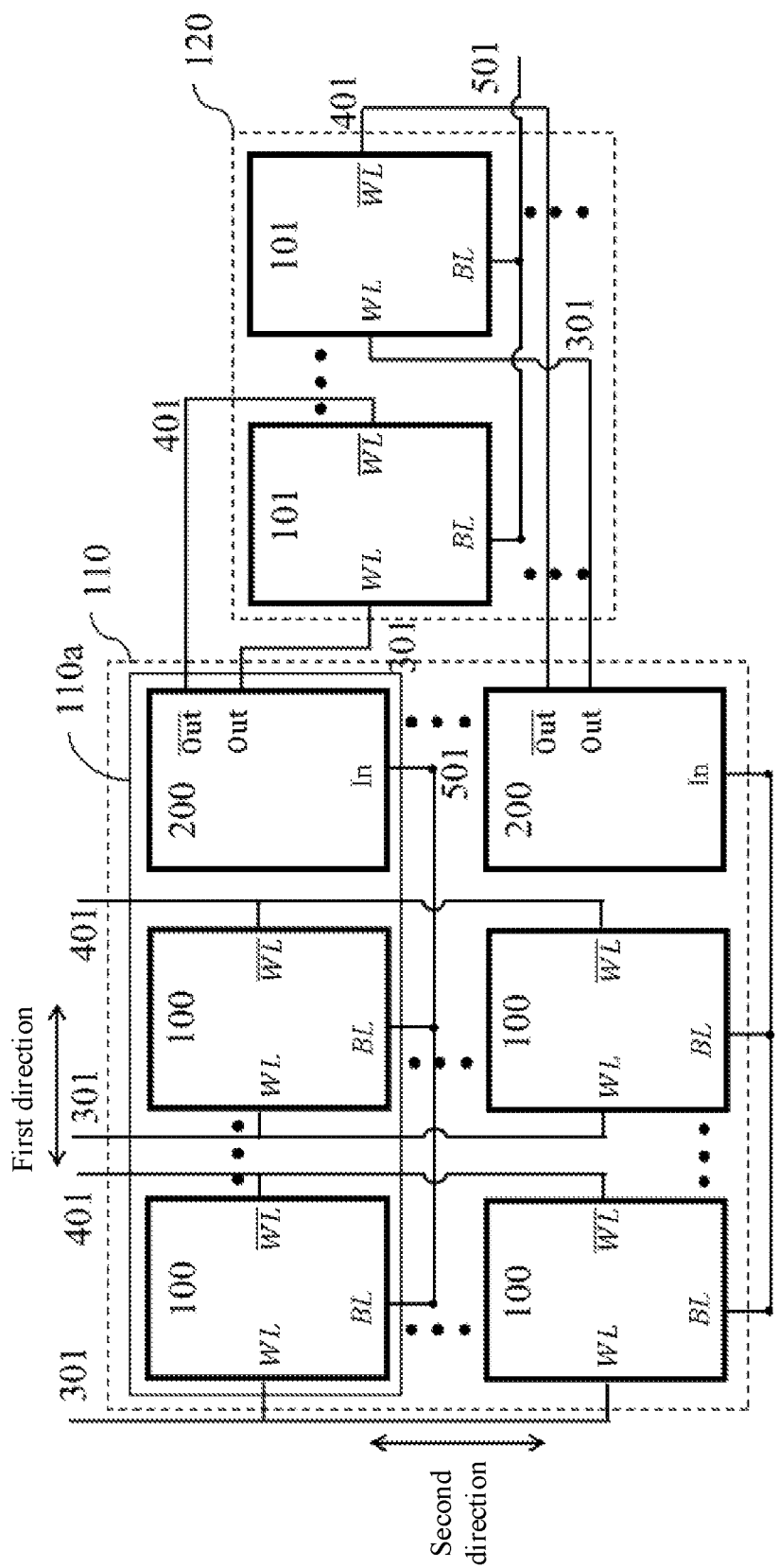
FIG. 4 is a schematic diagram of a structural composition of a BNN circuit according to the embodiments of the present disclosure.

As shown in FIG. 4, according to another aspect of the present disclosure, there is provided a BNN circuit, including a multi-level neural network layer 110, 120, . . . . The neural network layer 110 of the multi-level neural network layer includes a plurality of memory cell array groups 110a, . . . , arranged in parallel along a second direction. Each memory cell array group 110a among the plurality of memory cell array groups includes a plurality of the above symmetric memory cells 100 and an interface module 200. The plurality of the above symmetric memory cells 100 are arranged along a first direction for storing a weight value 1 or 0. The interface module 200 is arranged at one end of each memory cell array group 110a, and configured for an input and an output of each memory cell array group 110a.

Figure 1B:
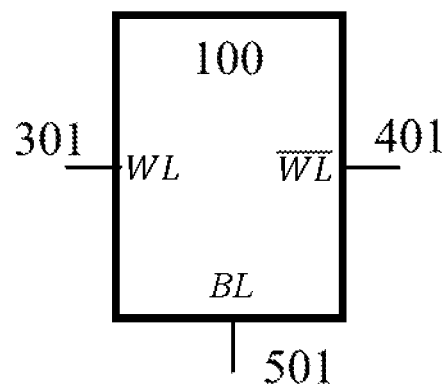
FIG. 1B is a schematic diagram of a corresponding circuit module of a symmetric memory cell according to the embodiments of the present disclosure.

Referring to FIG. 1A, FIG. 1B and FIG. 4, as shown in the memory cell array group 110a, a plurality of symmetric memory cells 100 are arranged in the first direction. One end of the memory cell array group 110a is a symmetric memory cell 100, and the symmetric memory cell 100 at another end thereof is arranged corresponding to the interface module. Connection setting of each symmetric memory cell 100 and the interface module 200 in the BNN circuit are achieved through a word line WL301, a complementary word line 401 and a bit line BL501. Each symmetric memory unit 100 is connected to the interface module 200 through the bit line BL501 for controlling an input of each symmetric memory cell 100 to the interface module 200. That is, a connection end of the bit line BL501 of the interface module 200 is an input end in.

In this way, the symmetric memory unit 100 and the interface module 200 may be arranged in the first direction and the second direction to form a first-level neural network layer, thereby achieving a BNN circuit having a multiple-layered neural network layer. In the BNN circuit of the present disclosure, with the above design of the symmetric memory cell, a reading operation on the weight unit by a complex circuit such as a sensitive current amplifying circuit is no longer required, so that the size of the memory having the BNN circuit is greatly reduced, and at the same time, the time delay of the reading operation caused by the complex reading circuit is reduced. Moreover, in the case that the complex reading circuit is omitted, the power consumption will be further reduced.

TABLE 1

| | Input | |
|---|---|---|
| | 1 | 0 |
| Word line 301 | $V_{DD}$ | $V_{GND}$ |
| Complementary word line 401 | $V_{GND}$ | $V_{DD}$ |
| Weight value 1 | BL is a high level | BL is a low level |
| Weight value 0 | BL is a low level | BL is a high level |

Specifically, as shown in Table 1, during an operation of the above BNN circuit, when the positive word line 301 is at a high level, and the complementary word line 401 is at a low level, then the input of the symmetric memory cell 100 is 1. When the positive word line 301 is at a low level, and the complementary word line 401 is at a high level, the input of the symmetric memory cell 100 is 0. When the weight value stored in the symmetric memory cell 100 is the same as the input, the bit line BL501 is charged, and when the weight value stored in the symmetric memory cell 100 is different from the input, the bit line 501 is discharged. When there are more symmetric memory cells 100 on the bit line 501 that are the same as the input, an output of the bit line is 1. Otherwise, when there are more symmetric memory cells 100 on the bit line 501 that are different from the input, the output of the bit line is 0. On this basis, a quantitative relationship between the output cells and matching cells on the bit line may be reflected.

Figure 5A:
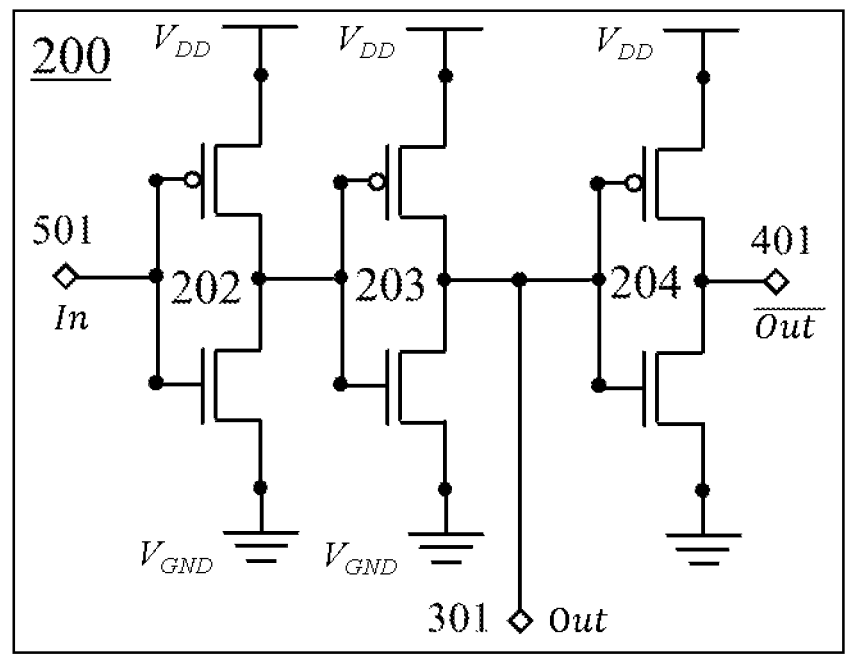
FIG. 5A is a schematic diagram of a structural composition of an interface module according to the embodiments of the present disclosure.
Figure 5B:
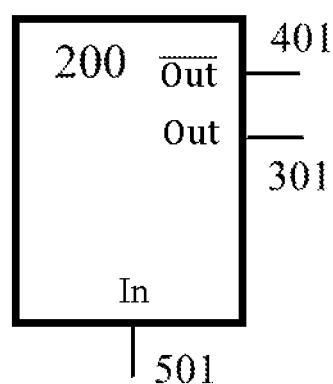
FIG. 5B is a schematic diagram of a corresponding circuit module of an interface module according to the embodiments of the present disclosure.

As shown in FIG. 4, FIG. 5A and FIG. 5B, according to the embodiments of the present disclosure, the interface module 200 includes a first inverter 202 and a second inverter 203, the second inverter 203 being connected to the first inverter 202 in series and configured to correct an output waveform to a high level and/or a low level for a binarization of a neutral network. The interface module 200 may also be used as a connection port or interface between the neural network layer where it is located and a next level neural network layer, and it may be understood as an intermediate connection channel. For example, the connection ports between the neural network layer 110 and the next level neural network layer 120 are a plurality of interface modules 200 of the neural network layer 110.

As shown in FIG. 4, FIG. 5A and FIG. 5B, according to the embodiments of the present disclosure, one end of the first inverter 202 is connected to a working voltage $V_{DD}$, another end thereof is grounded to a $V_{GND}$. An input end In of the first inverter 202 is connected to a bit line BL 501 of each memory cell array group as an input of the first inverter 202. One end of the second inverter 203 is connected to the working voltage $V_{DD}$, another end thereof is grounded to the $V_{GND}$. An input end of the second inverter 203 is connected to an output end of the first inverter 202, and the output end Out of the second inverter 203 is connected to a positive word line WL 301 of a next level neural network layer adjacent to the each level of the neural network layer.

As shown in FIG. 4, FIG. 5A and FIG. 5B, according to the embodiments of the present disclosure, the interface module 200 further includes a third inverter 204. One end of the third inverter 204 is connected to a working voltage $V_{DD}$, another end thereof is grounded to a $V_{GND}$, an input end is connected to an output end Out of the second inverter 203, and an output end $\overline{Out}$ thereof is connected to a complementary word line 401 of a next level neural network layer adjacent to the each level of the neural network layer. On this basis, the interface module 200 may connect the neural network layer where it is located to a next level neural network layer, so as to ensure a formation of a complete BNN circuit. Specifically, as shown in FIG. 4, the bit lines 501 of the plurality of symmetrical memory cells 100 in the memory cell array group 110a of the neural network layer 110 are input to the input end In of the interface module 200 at another end of the memory cell array group 110a, the positive output terminal Out of the interface module 200 is input to the positive word line 301 of the symmetrical memory cell 100 at one end of the memory cell array group at a corresponding position of the next level neural network layer 120, and a complementary output end $\overline{Out}$ of the interface module 200 is input to the complementary word line 401 of the symmetric memory cell 100 at one end of the memory cell array group at a corresponding position of the next level neural network layer 120.

According to the present disclosure, there is provided a symmetric memory cell and a BNN circuit. The symmetric memory cell includes a first complementary structure and a second complementary structure, the second complementary structure being symmetrically connected to the first complementary structure in a first direction, wherein the first complementary structure includes a first control transistor configured to be connected to the second complementary structure, the second complementary structure includes a second control transistor, a drain electrode of the second control transistor and a drain electrode of the first control transistor being symmetrically arranged in the first direction and connected to a bit line, and the symmetric memory cell is configured to store a weight value 1 or 0. With the symmetric memory cell in the present disclosure, the breakpoint data of the BNN circuit may be kept, and the power consumption may be reduced at the same time. A complex reading circuit such as a sensitive current amplifying circuit is no longer required for the BNN circuit. Therefore the size of the memory is greatly reduced, and the time delay and the power consumption are also reduced. In addition, the current of such symmetric memory cell is smaller, so that a large scale parallel inference operation may be achieved on the BNN circuit.

So far, the embodiments of the present disclosure are described in detail with reference to the accompanying drawings.

The specific embodiments described above further describe the objects, technical solutions and beneficial effects of the present disclosure in detail. It should be understood that the above are only specific embodiments of the present disclosure, and are not intended to limit the present disclosure. Any modification, equivalent replacement, improvement, etc. made within the spirit and principle of the present disclosure shall be included within the protection scope of the present disclosure.

What is claimed is:

1. A BNN circuit, comprising a multi-level neural network layer, wherein each level of the neural network layer of the multi-level neural network layer comprises:
   a plurality of memory cell array groups arranged in parallel in a second direction;
   wherein each memory cell array group among the plurality of memory cell array groups comprises:
   a plurality of symmetric memory cells, arranged in a first direction for storing a weight value 1 or 0; and
   an interface module arranged at one end of each memory cell array group, and configured for an input and an output of each memory cell array group,
   wherein the interface module comprises:
   a first inverter;
   a second inverter connected to the first inverter in series and configured to correct an output waveform to a high level and/or a low level binarization,
   wherein the interface module further comprises:
   a third inverter, wherein one end of the third inverter is connected to a working voltage $V_{DD}$, and another end of the third inverter is connected to a $V_{GND}$, an input end of the third inverter is connected to an output end of the second inverter, and an output end of the third inverter is connected to a complementary word line of a next level neural network layer adjacent to the each level of the neural network layer.

2. The BNN circuit of claim 1, the symmetric memory cell comprising:
   a first complementary structure,
   a second complementary structure symmetrically connected to the first complementary structure in a first direction; wherein,
   the first complementary structure comprises:
   a first control transistor configured to be connected to the second complementary structure;
   the second complementary structure comprises:

a second control transistor, a drain electrode of the second control transistor and a drain electrode of the first control transistor being symmetrically arranged in the first direction and being connected to a bit line; and the symmetric memory cell is configured to store a weight value 1 or 0.

3. The BNN circuit of claim 2, wherein, a gate electrode of the first control transistor is connected to a positive word line; and a gate electrode of the second control transistor is connected to a complementary word line;

wherein the first control transistor and the second control transistor are configured to control a reading and a writing of the symmetric memory cell.

4. The BNN circuit of claim 3, wherein the first complementary structure further comprises:

a first pull-up diode, one end of the first pull-up diode being configured to connect to a working voltage $V_{DD}$, another end of the first pull-up diode being connected to a source end of the first control transistor, and the first pull-up diode being configured to control a high level input;

a first pull-down diode, one end of the first pull-down diode being grounded to a $V_{GND}$, another end of the first pull-down diode being connected to the source end of the first control transistor, and the first pull-down diode being configured to control a low level input;

wherein the first pull-up diode and the first pull-down diode are symmetrically arranged in a second direction, and the second direction is perpendicular to the first direction.

5. The BNN circuit of claim 4, wherein, when a weight value 1 is stored in the symmetric memory cell, opening directions of the first pull-up diode and the first pull-down diode point to the source end of the first control transistor; and wherein the first pull-up diode and the first pull-down diode are programmable diodes.

6. The BNN circuit of claim 3, wherein the second complementary structure further comprises:

a second pull-up diode, one end of the second pull-up diode being configured to be connected to a working voltage $V_{DD}$, another end of the second pull-up diode being connected to a source end of the second control transistor, and the second pull-up diode being configured to control a high level input;

a second pull-down diode, one end of the second pull-down diode being grounded to a $V_{GND}$, and another end of the second pull-down diode being connected to the source end of the second control transistor, and the second pull-down diode being configured to control a low level input;

wherein the second pull-up diode and the second pull-down diode are symmetrically arranged in a second direction.

7. The BNN circuit of claim 6, wherein when a weight value 0 is stored in the symmetric memory cell, opening directions of the second pull-up diode and the second pull-down diode point to the source end of the second control transistor; and wherein the second pull-up diode and the second pull-down diode are programmable diodes.

8. The BNN circuit of claim 5, wherein the programmable diode comprises:

a lower electrode layer configured to support the programmable diode and provide a lower electrode of the programmable diode;

a dielectric layer formed on the lower electrode layer and configured as a functional layer of the programmable diode, so as to be kept in a stable state after a withdrawal of an electrical signal; and an upper electrode layer formed on the dielectric layer and configured to provide an upper electrode of the programmable diode.

9. The BNN circuit of claim 8, wherein the lower electrode layer is composed of at least one of W, Al, Ti, Ta, Ni, Hf, TiN or TaN;

the dielectric layer is composed of at least one material having a ferroelectric property among a perovskite ferroelectric material, a ferroelectric polymer-PVDF material or an $HfO_2$-based ferroelectric material, or composed of a dielectric material having a charged defect; and the upper electrode layer is composed of at least one of W, Al, Cu, Ru, Ti, Ta, TiN, TaN, $IrO_2$, ITO or IZO.

10. The BNN circuit of claim 9, wherein the $HfO_2$-based ferroelectric material is an $HfO_2$-based material doped with at least one element of Zr, Al, Si, or La.

11. The BNN circuit of claim 1, wherein, one end of the first inverter is connected to a working voltage $V_{DD}$, another end of the first inverter is grounded to a $V_{GND}$, and an input end of the first inverter is connected to a bit line of each memory cell array group; and one end of the second inverter is connected to the working voltage $V_{DD}$, another end of the second inverter is grounded to the $V_{GND}$, an input end of the second inverter is connected to an output end of the first inverter, and the output end of the second inverter is connected to a positive word line of a next-level neural network layer adjacent to the each level of the neural network layer.

12. The BNN circuit of claim 7, wherein the programmable diode comprises:

a lower electrode layer configured to support the programmable diode and provide a lower electrode of the programmable diode;

a dielectric layer formed on the lower electrode layer and configured as a functional layer of the programmable diode, so as to be kept in a stable state after a withdrawal of an electrical signal; and an upper electrode layer formed on the dielectric layer and configured to provide an upper electrode of the programmable diode.

13. The BNN circuit of claim 12, wherein the lower electrode layer is composed of at least one of W, Al, Ti, Ta, Ni, Hf, TiN or TaN;

the dielectric layer is composed of at least one material having a ferroelectric property among a perovskite ferroelectric material, a ferroelectric polymer-PVDF material or an $HfO_2$-based ferroelectric material, or composed of a dielectric material having a charged defect; and the upper electrode layer is composed of at least one of W, Al, Cu, Ru, Ti, Ta, TiN, TaN, $IrO_2$, ITO or IZO.

14. The BNN circuit of claim 13, wherein the $HfO_2$-based ferroelectric material is an $HfO_2$-based material doped with at least one element of Zr, Al, Si, or La.

* * * * *